(12) United States Patent
Ponomarev

(10) Patent No.: US 7,416,957 B2
(45) Date of Patent: Aug. 26, 2008

(54) METHOD FOR FORMING A STRAINED SI-CHANNEL IN A MOSFET STRUCTURE

(75) Inventor: Youri Ponomarev, Leuven (BE)

(73) Assignee: NXP B.V., Eindhoven (NL)

(*) Notice: Subject to any disclaimer, the term of this patent is extended or adjusted under 35 U.S.C. 154(b) by 77 days.

(21) Appl. No.: 10/596,422

(22) PCT Filed: Nov. 30, 2004

(86) PCT No.: PCT/IB2004/052598

§ 371 (c)(1),
(2), (4) Date: Jun. 13, 2006

(87) PCT Pub. No.: WO2005/059979

PCT Pub. Date: Jun. 30, 2005

(65) Prior Publication Data

US 2007/0166960 A1    Jul. 19, 2007

(30) Foreign Application Priority Data

Dec. 16, 2003  (EP) ................................. 03104732

(51) Int. Cl.
*H01L 21/30* (2006.01)
(52) U.S. Cl. .................. 438/455; 438/479; 438/482; 438/486; 257/347; 257/616
(58) Field of Classification Search ............... 438/455, 438/478, 479, 482, 486, 471, 474, 475
See application file for complete search history.

(56) References Cited

U.S. PATENT DOCUMENTS

| | | | |
|---|---|---|---|
| 6,410,371 B1* | 6/2002 | Yu et al. ...................... 438/151 |
| 6,455,398 B1* | 9/2002 | Fonstad et al. ............... 438/459 |
| 6,689,671 B1* | 2/2004 | Yu et al. ....................... 438/486 |
| 6,774,015 B1* | 8/2004 | Cohen et al. ................. 438/479 |
| 2002/0140031 A1* | 10/2002 | Rim ............................ 257/347 |
| 2003/0077882 A1* | 4/2003 | Shih et al. .................... 438/478 |
| 2003/0218189 A1* | 11/2003 | Christiansen et al. ........ 257/200 |
| 2004/0087114 A1* | 5/2004 | Xiang et al. ................. 438/478 |

* cited by examiner

*Primary Examiner*—Ha Nguyen
*Assistant Examiner*—Daniel Whalen
(74) *Attorney, Agent, or Firm*—Peter Zawilski

(57) ABSTRACT

Method for forming a strained Si layer on a substrate (1), including formation of: an epitaxial SiGe layer (4) on a Si surface, and of: the strained Si layer by epitaxial growth of the Si layer on top of the epitaxial SiGe layer (4), the Si layer being strained due to the epitaxial growth, wherein the substrate (1) is a Silicon-On-Insulator substrate with a support layer (1), a buried silicon dioxide layer (BOX) and a monocrystalline Si surface layer (3), the method further including: ion implantation of the Si surface layer (3) and the epitaxial SiGe layer (4) to transform the Si surface layer (3) into an amorphous Si layer (3B) and a portion of the epitaxial SiGe layer (4) into an amorphous SiGe layer (5), a further portion of the epitaxial SiGe layer (4) being a remaining monocrystalline SiGe layer (6), the amorphous Si layer (3B), the amorphous SiGe layer and the remaining monocrystalline SiGe layer (6) forming a layer stack (3B, 5, 6) on the buried silicon dioxide layer (BOX), with the amorphous Si layer (3B) being adjacent to the buried silicon dioxide layer (BOX).

6 Claims, 2 Drawing Sheets

METHOD FOR FORMING A STRAINED SI-CHANNEL IN A MOSFET STRUCTURE

The present invention relates to a method for forming a strained Si-layer on a semiconductor surface as defined in the preamble of claim 1.

Also, the present invention relates to a MOSFET structure comprising a strained Si-channel formed by the above mentioned method.

Furthermore, the present invention relates to a semiconductor device comprising such a MOSFET structure with a strained Si channel.

A method for forming a strained Si-channel in a MOSFET structure is known from US 2002/0008289 A1. Application of a strained Si-channel in a MOSFET structure improves the mobility of charge carriers in the structure, which allows high speed of the MOSFET device. US 2002/0008289 A1 describes a MOSFET structure which comprises a strained Si channel below the gate region. The channel is part of a stacked layer consisting of a first lower Si layer, a SiGe layer and a second upper Si layer.

The first lower Si layer is a monocrystalline layer. On top of this layer the SiGe layer is formed as an epitaxial layer.

The second upper Si layer is formed on this monocrystalline SiGe layer in an epitaxial form.

It is known that the lattice parameter of Si differs from (is smaller than) the lattice parameter of SiGe (as a function of the Ge content of the SiGe crystal). Due to the mismatch between the Si lattice and the SiGe lattice, an epitaxial Si layer grown on SiGe is strained relative to its normal lattice parameter.

In the stacked layer described in US 2002/0008289 A1, the SiGe is also strained due to its epitaxial relation to the first lower Si layer.

A further strained Si channel structure is disclosed in U.S. Pat. No. 6,429,061 B1. The strained Si layer is formed in this case on a relaxed SiGe layer, i.e. the relaxed SiGe layer has the same crystal structure and the same crystal orientation as the underlying Si surface, yet without strain due to the presence of dislocations at the Si—SiGe interface.

Disadvantageously, both methods require the strict conditions of epitaxial deposition processes for both the Si and the SiGe layer.

It is known that in order to avoid formation of defects in the Strained Si (SS) grown in conventional manner, a very thick epitaxial SiGe layer has to be grown (with a thickness in the order of several microns, a so-called "buffer layer", e.g., a graded relaxed SiGe layer is formed by increasing the Ge content from 0 to 20% over the thickness of 1.5 µm. The graded buffer layer is usually capped with a ~0.7 µm thick relaxed SiGe layer with constant (20%) Ge content). Growth and integration of a thick relaxed SiGe graded buffer layer present significant challenges. The threading dislocation defect density in the relaxed SiGe layer grown by the linear graded buffer technique is roughly $10^5$ cm$^{-2}$ (See, for example, J. J. Welser, "*The application of strained-silicon/relaxed-silicon germanium heterostructures to metal-oxide-semiconductor field-effect transistors,*" Ph.D. dissertation, Dept. Elect. Eng., Stanford Univ., Stanford, Calif., 1994). In such a process, defect control cannot be improved, resulting in low yield of the future mass-production process (thus with corresponding high costs).

It is evident that minimizing the thickness of the relaxed SiGe layer is beneficial in several ways. First, a thinner relaxed SiGe layer improves the thermal conductance of the structure and reduces self-heating effects. Second, it simplifies device isolation. Third, the junction leakage (from the smaller band gap) and junction capacitance (from the larger dielectric constant) can be reduced. Ideally, the SiGe layer should be less than 100 nm thick to take advantage of reduced self-heating and simplicity in the isolation scheme.

Another note: for future CMOS technology nodes, it is imperative to have SS on SOI to make sure MOSFET devices with gate lengths smaller than ~40 nm behave properly (otherwise, so called "short-channel-effects" will render devices unusable—in such devices the gate electrode will have no control over the transistor channel region, making field effect action impossible). Such SS on SOI wafers are very difficult to make and usually accomplished by, e.g., relaxed SiGe. Strained Si layers can be epitaxially grown and bonded to a handle wafer using a combination of SmartCut®, CMP, and selective chemical etch processes (see, for example, Zhiyuan Cheng; Taraschi, G.; Currie, M. T.; Leitz, C. W.; Lee, M. L.; Pitera, A.; Langdo, T. A.; Hoyt, J. L.; Antoniadis, D. A.; Fitzgerald, E. A. "*Relaxed Silicon-germanium on insulator substrate by layer transfer*", Journal of Electronic Materials vol. 30, no. 12:L37-9, December 2001; or a variation of a standard SIMOX approach (see, for example, T. Mizuno, S. Takagi, N. Sugiyama, H. Satake, A. Kurobe, and A. Toriumi, "*Electron and hole mobility enhancement in strained-Si MOSFETs on SiGe-on-insulator substrates fabricated by SIMOX technology,*" IEEE Electron Device Lett., vol. 21, pp. 230-232, May 2000).

It is an object of the present invention to provide an alternative method for forming a strained Si layer on a semiconductor surface. The object is achieved by the method as defined in the preamble of claim 1, characterized in that the substrate is a Silicon-On-Insulator substrate comprising a support layer, a buried silicon dioxide layer and a monocrystalline Si surface layer, the method further comprising:

ion implantation of the Si surface layer and the epitaxial SiGe layer to transform the Si surface layer into an amorphous Si layer and a portion of the epitaxial SiGe layer into an amorphous SiGe layer, a further portion of the epitaxial SiGe layer being a remaining monocrystalline SiGe layer, the amorphous Si layer, the amorphous SiGe layer and the remaining monocrystalline SiGe layer forming a layer stack on the buried silicon dioxide layer, with the amorphous Si layer being adjacent to the buried silicon dioxide layer.

Advantageously, the method according to the present invention requires only a single epitaxial deposition process. A lower thermal budget is thus needed in the formation of a MOSFET structure by using the method according to the present invention.

Moreover, the present invention relates to a MOSFET structure comprising a strained Si channel formed by the method as described above.

Furthermore, the present invention relates to a semiconductor device comprising a MOSFET structure comprising a strained Si channel formed by the method as described above.

For the purpose of teaching of the invention, preferred embodiments of the method and devices of the invention are described below. It will be appreciated by the person skilled in the art that other alternative and equivalent embodiments of the invention can be conceived and reduced to practice without departing form the true spirit of the invention, the scope of the invention being limited only by the appended claims.

The substrate for forming a MOSFET structure having a strained Si channel is, in accordance with the present invention, a silicon-on-insulator (SOI) substrate SUB. The SOI wafer comprises a supporting Si layer 1, a buried silicon dioxide layer BOX, and a top silicon layer Si 3. The top Si layer 3 on the SOI wafer is monocrystalline.

As an initial processing step, the Si layer 3 on the SOI wafer is thinned to a thickness of about 5 nm.

Figure 1:
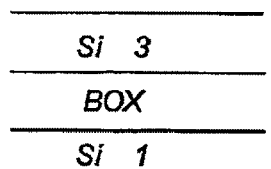
FIG. 1 shows a cross-sectional view of a substrate for forming a strained Si channel for MOSFET structures.
Figure 2:
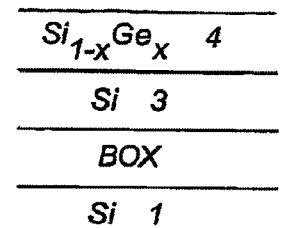
FIG. 2 shows a cross-sectional view of the substrate after a first processing stage.

FIG. 2 shows a cross-sectional view of the substrate after a first processing stage.

In the first process an epitaxial $Si_{1-x}Ge_x$ layer 4 is deposited by one of the well-known deposition processes: Chemical Vapour Deposition (CVD), Molecular Beam Epitaxy (MBE), or Laser Ablation, or by any other process for forming an epitaxial $Si_xGe_{1-x}$ layer.

The epitaxial $Si_{1-x}Ge_x$ layer 4 may comprise any amount x of Germanium to provide an epitaxial layer on Si. The amount x determines the lattice mismatch with respect to Si. Moreover, the amount x may vary across the thickness of the epitaxial $Si_{1-x}Ge_x$ layer to form a buffer layer.

The thickness of the $Si_{1-x}Ge_x$ layer 4 depends on the Ge content and is at least ~20 nm in order to ensure the formation of a relaxed layer.

Figure 3:
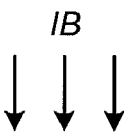
FIG. 3 shows a cross-sectional view of the substrate during a second processing stage.
Figure 3:
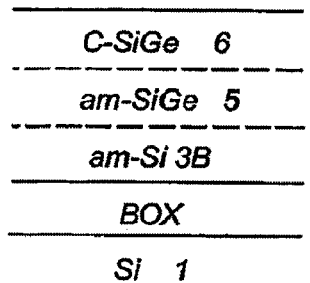

FIG. 3 shows a cross-sectional view of the substrate during a second processing stage.

In a second processing stage the stack of the $Si_{1-x}Ge_x$ layer 4 (in the following denoted as SiGe layer 4) and the Si layer 3 is exposed to an ion-implantation process. The ion beam aimed at the surface is denoted by arrows IB.

The settings of the ion-implantation process are chosen in such a way as to convert the crystalline Si layer 3 completely into an amorphous Si layer (am-Si) 3B. Further, a portion am-SiGe 5 of the SiGe layer 4, adjacent to the Si layer 3 also becomes amorphous in the ion-implantation process. The remainder 6 of the SiGe layer remains crystalline (denoted as c-SiGe).

Persons skilled in the art will appreciate that the settings of the ion implantation process depend on the actual thickness of the Si and SiGe layers 3, 4. For a SiGe layer thickness of 50 nm and a Si layer thickness of 5 nm, an ion beam energy of about 50 keV and a dose of about $1 \times 10^{15}$ ions/cm$^2$ may suffice. The ion beam may consist of any usable element, like Si, Ge, B or P.

During this processing stage, a patterning step may be performed for the patterning of the active part of a MOSFET in the amorphous Si layer 3B, the amorphous SiGe layer 5 and the remaining crystalline SiGe layer 6. The patterning can be done by any known lithographic process.

It is noted that this patterning may be omitted for the formation of a strained Si layer as such.

Figure 4:
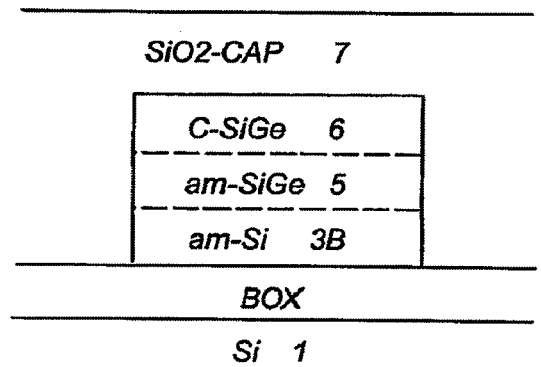
FIG. 4 shows a cross-sectional view of the substrate after a subsequent processing stage.

FIG. 4 shows a cross-sectional view of the substrate after a subsequent processing stage. In a first embodiment of the method according to the present invention, the patterned amorphised layer stack 3B, 5 is covered by a capping silicon-dioxide layer ($SiO_2$ cap) 7.

The silicon-dioxide layer 7 is deposited by a low-temperature deposition process (i.e. below 525° C.) to prevent uncontrolled re-crystallization of the amorphous Si layer 3B and the amorphous SiGe (am-SiGe) layer 5 during deposition of the silicon-dioxide layer 7.

Figure 5:
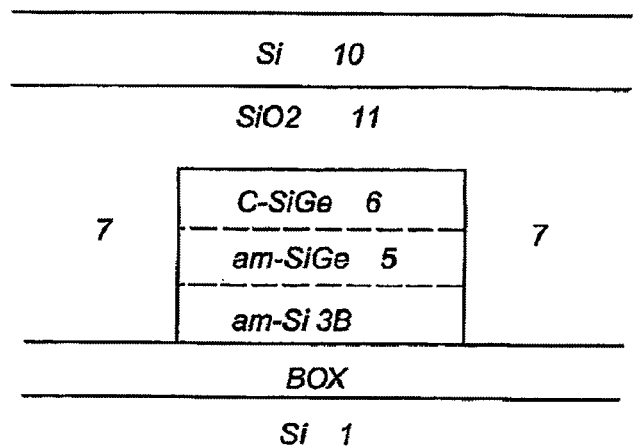
FIG. 5 shows a cross-sectional view of the substrate in a first embodiment after a wafer bonding process.

FIG. 5 shows a cross-sectional view of the substrate in a first embodiment after a wafer bonding process.

Next, a second substrate 10 provided with a top silicon-dioxide layer ($SiO_2$) 11 is bonded to the initial substrate 1 by a wafer bonding process known in the art. The top silicon-dioxide layer 11 of the second substrate 10 is located face-to-face on the surface of the capping silicon-dioxide layer 7 of the substrate 1.

Figure 6:
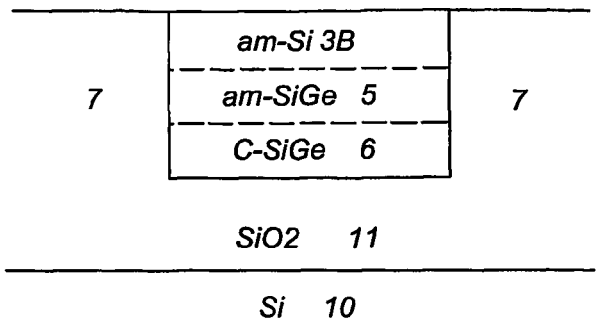
FIG. 6 shows a cross-sectional view of the substrate in the first embodiment after a further processing stage.

FIG. 6 shows a cross-sectional view of the substrate in the first embodiment after a further processing stage.

In a further processing stage, the supporting silicon layer 1 and the silicon dioxide layer BOX of the substrate 1 are removed by a processing sequence of etching the supporting Si layer 1 and etching the buried silicon dioxide layer BOX. The silicon dioxide layer BOX serves as a stop layer for the etching of the supporting silicon layer 1. The am-Si layer 3B serves as a stop layer for the etching of the buried silicon dioxide layer BOX.

After this processing sequence, the am-Si layer 3B is the top layer of the second substrate 10. The stack on second substrate 10 comprises (from top to bottom): am-Si layer 3B, am-SiGe layer 5, c-SiGe layer 6 and bonding silicon dioxide layers 7, 11.

Figure 7:
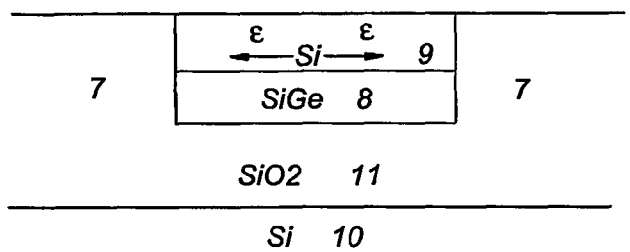
FIG. 7 shows a cross-sectional view of the substrate in the first embodiment after a final processing stage.

FIG. 7 shows a cross-sectional view of the substrate in the first embodiment after a final processing stage.

As a final processing stage, a re-crystallization of the amorphous layers is carried out by a solid phase epitaxy (SPE) regrowth process.

Typically, in such a process the layer stack is heated to a temperature in the range of 550-600° C.

Regrowth of crystalline SiGe and of crystalline Si takes place at a rate of ~2 nm/min (at 550° C.).

The am-SiGe layer 5 re-crystallizes in the crystal structure of the crystalline SiGe layer 6 to form a re-grown crystalline SiGe layer 8. The amorphous Si layer 3B grows epitaxially as a strained Si layer 9 on the re-grown crystalline SiGe layer 8. The mechanical strain in the strained Si layer 9 is depicted by the arrows.

Next, in further processing stages a MOSFET structure can be constructed on top of the strained Si layer 9 by manufacturing processes known in the art. The strained Si layer 9 comprises the channel region of the MOSFET.

Because of the patterning of the layered stack 3B, 5, 6 at an earlier stage, the strain 8 which develops in the strained Si layer 9 due to the epitaxy is uniform. The uniformity of the mechanical strain beneficially influences the electrical characteristics of the channel of the MOSFET structure (to be formed).

It is noted that to preserve the strain ε of the strained Si layer 9 the processing temperature during the further formation steps of the MOSFET structure must be kept low: the actual value depends on the amount of strain in the Si layer as well as on the SiGe layer thickness (if present). The processing temperature may be approx. 500° C.

Figure 8:
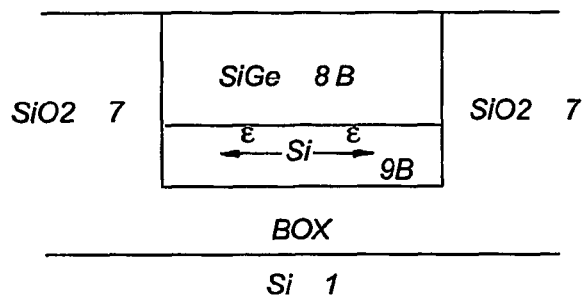
FIG. 8 shows a cross-sectional view of the substrate in a second embodiment after a third processing stage.

FIG. 8 shows a cross-sectional view of the substrate in a second embodiment after a third processing stage.

In FIG. 8 entities with the same reference number refer to the same entities as shown in the preceding figures.

In a second embodiment of the present invention, after the ion implantation process to form amorphous Si layer 3B, amorphous SiGe layer 5 and remainder crystalline SiGe layer 6 as explained above, in a next step, the SPE regrowth process is performed.

A strained epitaxial Si layer 9B is formed in between a re-grown monocrystalline SiGe layer 8B and the buried silicon dioxide layer BOX of the SOI substrate 1.

The formation of the epitaxial Si layer 9B is enhanced by the patterning step for the active part of the MOSFET as explained above with reference to FIG. 3. The patterning allows the Si layer to "slip" on the buried silicon dioxide layer BOX to perform a re-arrangement of the silicon atoms during the high temperature formation of the epitaxial Si layer 9B.

Relative to the re-grown SiGe layer 8B no "slip" occurs: the epitaxial Si layer 9B is strained by the re-grown SiGe layer 8B.

At a lower temperature than the temperature applied during the SPE regrowth process, no slip of the strained Si layer occurs, due to the much lower atomic mobility of Si at the interface with the $SiO_2$ at said lower temperature.

Figure 9:
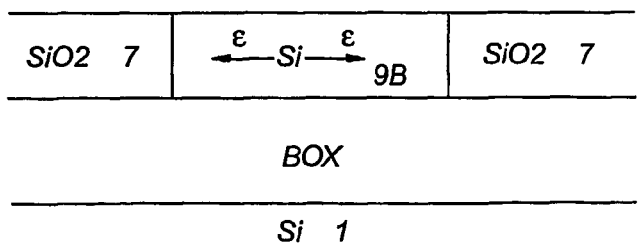
FIG. 9 shows a cross-sectional view of the substrate in the second embodiment after an alternative final processing stage.

FIG. 9 shows a cross-sectional view of the substrate in the second embodiment after an alternative final processing stage.

In FIG. 9 entities with the same reference number refer to the same entities as shown in the preceding figures.

In the alternative final stage of the second embodiment, the re-grown SiGe layer 8B is removed by etching. On the buried silicon dioxide layer BOX the Si layer 9B remains in its strained state.

To maintain the strained state during the remaining processing to form a MOSFET structure, all further processing must be done at a relatively low temperature (i.e. below the crystallization temperature of strained Si).

Advantageously, the second embodiment of the present invention provides a strained Si channel which may improve electrical characteristics in a MOSFET relative to the first embodiment, since leakage in such a MOSFET with a strained Si according to the second embodiment will be less due to the absence of SiGe (which has a smaller band gap than silicon).

Moreover, the second embodiment allows to omit the wafer bonding process and the removal of the supporting Si layer 1 and the buried silicon dioxide layer BOX during the processing sequence.

Furthermore, it is noted that in the first and the second embodiment the strained Si layer 9; 9B may provide for epitaxial growth of other materials with such a lattice mismatch that epitaxy on unstrained Si is not feasible. This may allow the integration of such materials as III-V or II-VI compounds in CMOS technology.

Finally, it is noted that in the first and second embodiment the strained Si layer 9; 9B is isolated from the Si substrate layer 1; 10 by a dielectric layer BOX; 11 (7, 11). This isolation may further improve the electrical properties of the MOSFET structure.

The invention claimed is:

1. Method for forming a strained Si layer comprising:
    forming an epitaxial SiGe layer on a monocrystalline Si surface layer of a substrate, the substrate including a support layer and a buried silicon dioxide layer, the monocrystalline Si surface layer residing on the buried silicon dioxide layer;
    ion implanting said Si surface layer and said epitaxial SiGe layer to transform said Si surface layer into an amorphous Si layer and a portion of said epitaxial SiGe layer into an amorphous SiGe layer, a further portion of said epitaxial SiGe layer being a remaining monocrystalline SiGe layer;
    said amorphous Si layer, said amorphous SiGe layer and said remaining monocrystalline SiGe layer forming a layer stack on said buried silicon dioxide layer;
    depositing a silicon dioxide capping layer on said remaining monocrystalline SiGe layer;
    bonding the silicon dioxide capping layer to a silicon dioxide surface layer of a second substrate and thereafter removing said support layer and said buried silicon dioxide layer by etching.

2. Method according to claim 1, further comprising patterning of said layer stack for forming active parts of a MOSFET structure.

3. Method according to claim 1, further comprising:
    re-crystallizing of said amorphous Si layer and said amorphous SiGe layer by a solid phase epitaxy regrowth process at an interface between said remaining monocrystalline SiGe layer and said amorphous SiGe layer,
    said amorphous Si layer being transformed into an epitaxial strained Si layer and said amorphous SiGe layer being transformed into a re-grown crystalline SiGe layer.

4. Method according to claim 1, characterized in that said strained Si layer is a gate channel in a MOSFET structure.

5. Method according to claim 3, characterized in that an annealing temperature during said solid phase epitaxy regrowth process is substantially below 600° C.

6. Method according to claim 1, characterized in that said Si surface layer has a thickness of less than 10 nm.

* * * * *